United States Patent [19]
Theil et al.

[11] Patent Number: 6,051,867
[45] Date of Patent: Apr. 18, 2000

[54] INTERLAYER DIELECTRIC FOR PASSIVATION OF AN ELEVATED INTEGRATED CIRCUIT SENSOR STRUCTURE

[75] Inventors: Jeremy A. Theil; Gary W. Ray, both of Mountain View; Frederick A. Perner, Palo Alto; Min Cao, Mountain View, all of Calif.

[73] Assignee: Hewlett-Packard Company, Palo Alto, Calif.

[21] Appl. No.: 09/306,238

[22] Filed: May 6, 1999

[51] Int. Cl.[7] .................................................. H01L 33/00
[52] U.S. Cl. .......................... 257/444; 257/446; 257/774
[58] Field of Search ................................ 257/444, 446, 257/776, 436, 435, 431, 292, 774, 773

[56] References Cited

U.S. PATENT DOCUMENTS

| | | | |
|---|---|---|---|
| 4,571,626 | 2/1986 | Yamada | 358/213 |
| 4,739,384 | 4/1988 | Higashi et al. | 357/30 |
| 5,929,474 | 7/1999 | Huang et al. | 257/292 |
| 5,936,261 | 8/1999 | Ma et al. | 257/59 |

*Primary Examiner*—Donald L. Monin, Jr.
*Attorney, Agent, or Firm*—Brian R. Short

[57] ABSTRACT

An integrated circuit sensor structure. The integrated circuit sensor structure includes a substrate which includes electronic circuitry. An interconnect structure is adjacent to the substrate. The interconnect structure includes conductive interconnect vias which pass through the interconnect structure. A dielectric layer is adjacent to the interconnect structure. The dielectric layer includes a planar surface, and conductive dielectric vias which pass through the dielectric layer and are electrically connected to the interconnect vias. The dielectric layer further includes an interlayer planarization dielectric layer adjacent to the interconnect structure, and a passivating layer adjacent to the interlayer planarization dielectric layer. The integrated circuit sensor structure further includes sensors adjacent to the dielectric layer. The interconnect vias and the dielectric vias electrically connect the electronic circuitry to the sensors.

9 Claims, 4 Drawing Sheets

INTERLAYER DIELECTRIC FOR PASSIVATION OF AN ELEVATED INTEGRATED CIRCUIT SENSOR STRUCTURE

FIELD OF INVENTION

This invention relates generally to passivation of integrated circuits. More particularly, this invention relates an interlayer dielectric which provides passivation of electrical interconnections and electrical circuitry associated with an array sensors of an integrated circuit.

BACKGROUND

Typically, integrated circuits include a passivation layer formed over a top surface of the integrated circuit. Generally, the passivation layer is an insulating, protective layer that prevents mechanical and chemical damage during assembly or packaging of the integrated circuit. In addition, the passivation layer can protect sensitive circuitry located on the top surface of the integrated circuit from damage due to moisture. The passivation layer should be impermeable to moisture, as moisture is one of the catalysts for corrosion of electrical interconnections and circuitry of integrated circuits.

FIG. 1 shows a prior art integrated circuit image sensor array. The integrated circuit image sensor array includes a substrate 100. An interconnection structure 110 is formed adjacent to the substrate 100. A pixel interconnect structure 120 is formed adjacent to the interconnection structure 110. Several layers 130 are formed over the pixel interconnect structure 120 which form an array of image sensors. Generally, electrodes 140, 142, 144 form cathodes of the image sensors. A transparent conductor 150 is formed adjacent to the layers 130 which form the array of image sensors. The transparent conductor 150 provides biasing of the anodes of the image sensors.

Typically, the interconnection structure 110 is a standard CMOS interconnection structure. The interconnection structure includes conductive vias 114, 116, 118 which provide electrical connections to the substrate 100.

The pixel interconnect structure 120 provides reliability and structural advantages to the elevated image sensor structure. The pixel interconnect structure 120 allows for the formation of thin pixel electrodes 140, 142, 144 because the pixel electrodes 140, 142, 144 are formed over silicon rather that a metal pad located on the interconnection structure 110. The pixel interconnect structure 120 electrically connects the pixel electrodes 140, 142, 144 to the interconnection structure 110. The pixel interconnect structure 120 is typically formed from a dielectric film, for example, polyimide, silicon oxide or a silicon nitride.

The pixel interconnect structure 120 of FIG. 1 does not provide protection of the conductive vias 114, 116, 118, or electrical circuitry located on the substrate 100 from moisture. Therefore, the conductive vias 114, 116, 118 and the electrical circuitry located on the substrate 100 are susceptible to corrosion.

Generally, the top surface of a passivation layer of a typical integrated circuit is not planar. That is, the top surface is not a well controlled flat surface. Therefore, a typical passivation layer cannot be sandwiched between layers of the integrated circuit image sensor array of FIG. 1.

High temperatures are required to form a passivation layer. Generally, the temperatures required to form the passivation layer are greater than the temperature that most sensors can withstand without being damaged. Therefore, a passivation layer cannot be formed over the integrated circuit image sensor array of FIG. 1. Additionally, a passivation layer formed over an integrated circuit image sensor array could absorb light before the light is absorbed or sensed by the image sensor array.

It is desirable to have a passivation structure formed over a substrate, which includes conductive vias which pass through the passivation structure so that image sensors can be located over the passivation structure and electrically connected to the substrate. It is further desirable that the passivation structure include a planar surface to allow the passivation layer to be sandwiched between the image sensors and the substrate.

SUMMARY OF THE INVENTION

The present invention is an integrated circuit sensor passivation structure which includes passivation of electrical interconnections and electrical circuitry associated with the image sensor array.

A first embodiment of the invention includes an integrated circuit sensor structure. The integrated circuit sensor structure includes a substrate which includes electronic circuitry. An interconnect structure is adjacent to the substrate. The interconnect structure includes conductive interconnect vias which pass through the interconnect structure. A dielectric layer is adjacent to the interconnect structure. The dielectric layer includes a planar surface, and conductive dielectric vias which pass through the dielectric layer and are electrically connected to the interconnect vias. The dielectric layer further includes an interlayer planarization dielectric layer adjacent to the interconnect structure, and a passivating layer adjacent to the interlayer planarization dielectric layer. The integrated circuit sensor structure further includes sensors adjacent to the dielectric layer. The interconnect vias and the dielectric vias electrically connect the electronic circuitry to the sensors.

A second embodiment of the invention is similar to the first embodiment. The dielectric layer of the second embodiment further includes an adhesion layer adjacent to the passivating layer.

A third embodiment of the invention is similar to the first embodiment. The sensors of the third embodiment include light sensitive active image sensors.

Other aspects and advantages of the present invention will become apparent from the following detailed description, taken in conjunction with the accompanying drawings, illustrating by way of example the principles of the invention.

DETAILED DESCRIPTION

Figure 1:
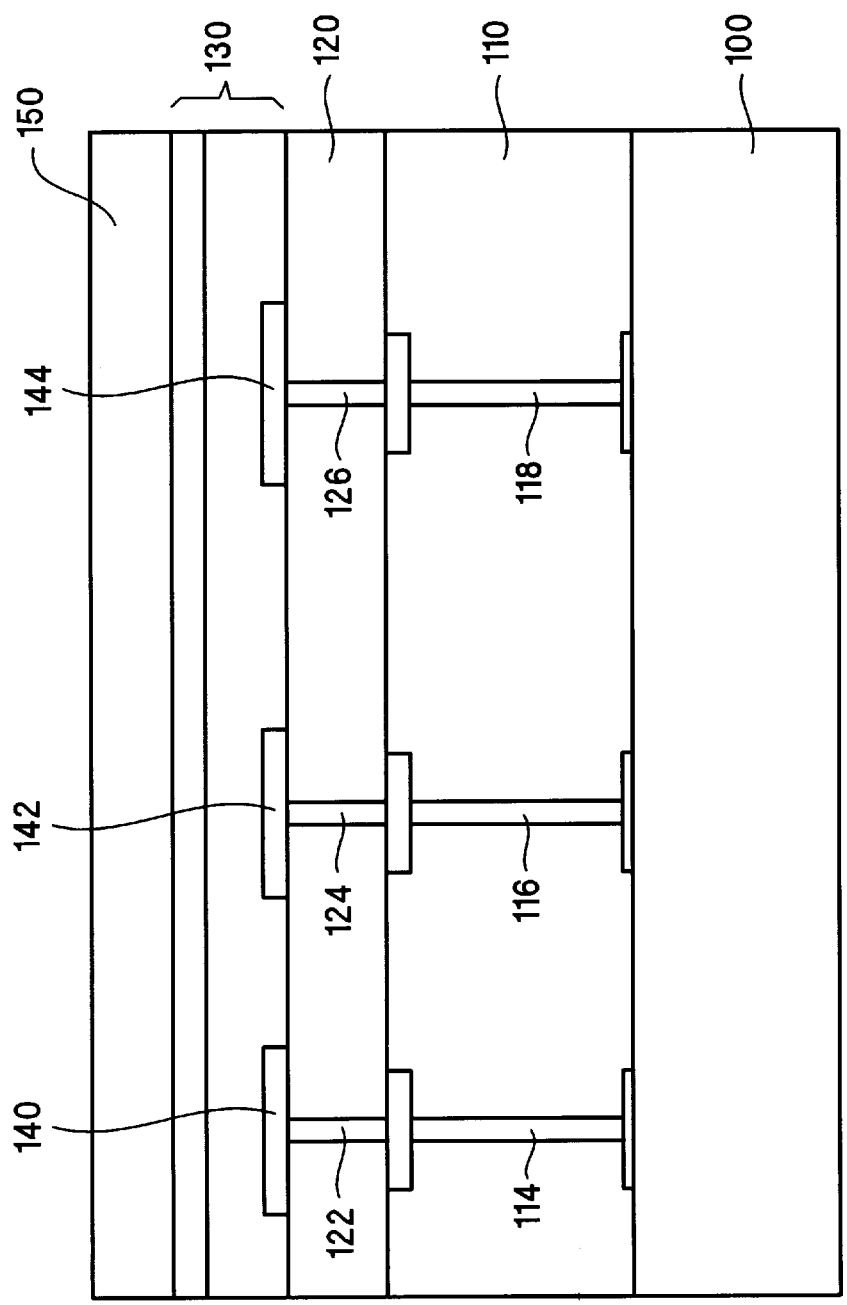
FIG. 1 shows a prior art image sensor array which does not include passivation protection of electrical circuitry associated with the image sensors.

As shown in the drawings for purposes of illustration, the invention is embodied in an image sensor array passivation structure which provides the electrical interconnections and electrical circuitry associated with the image sensor array protection from moisture.

Figure 2:
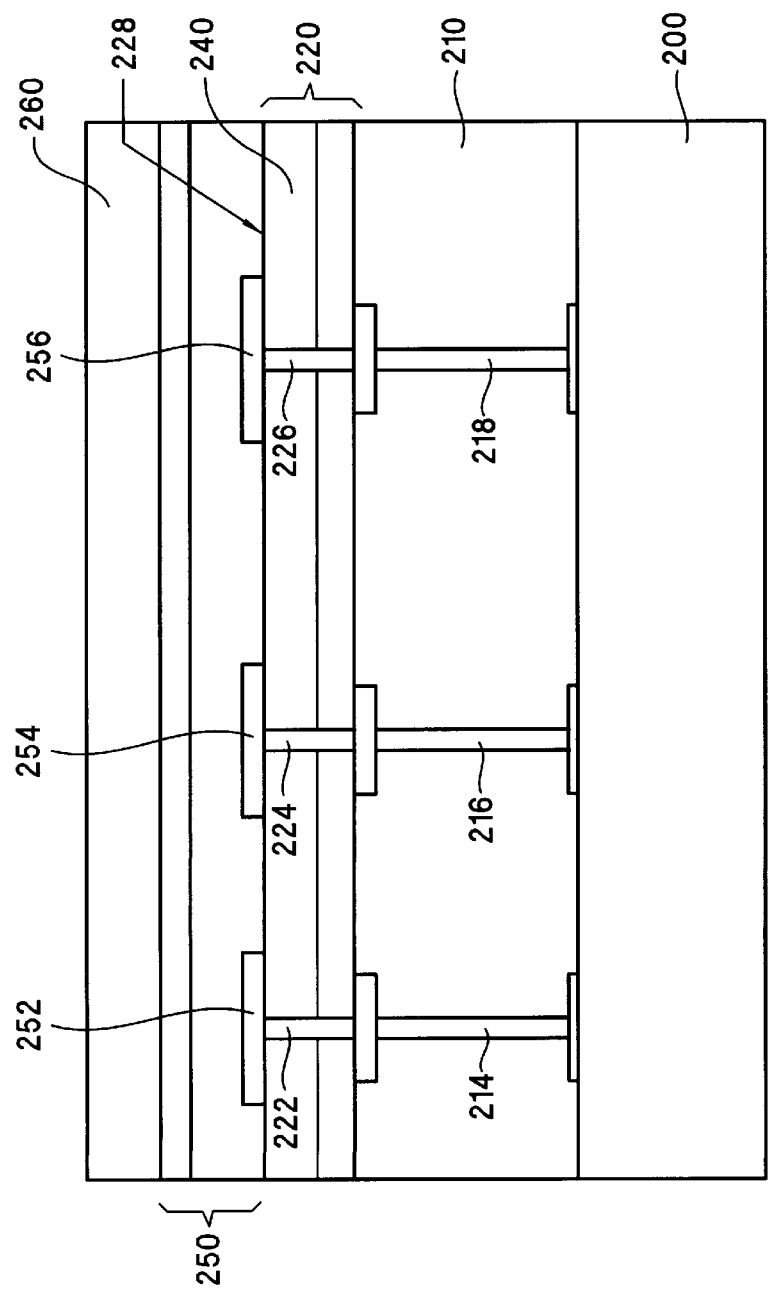
FIG. 2 shows an embodiment of the invention which includes passivation protection of electrical interconnects and electrical circuitry associated with an array of image sensors.

FIG. 2 shows an embodiment of the invention which includes an integrated circuit passivation structure. The integrated circuit passivation structure includes a substrate 200. The substrate 200 typically includes electronic circuitry. An interconnect structure 210 is formed adjacent to the substrate 200. The interconnect structure 210 includes conductive interconnect vias 214, 216, 218 which pass through the interconnect structure 210. A dielectric layer 220 is formed adjacent to the interconnect structure 210. The dielectric layer 220 includes a planar surface 228. The dielectric layer includes conductive dielectric vias 222, 224, 226 which pass through the dielectric layer 220 and are electrically connected to the interconnect vias 214, 216, 218. The dielectric layer 220 further includes an interlayer planarization dielectric layer 230 adjacent to the interconnect structure 210, and a passivating layer 240 adjacent to the dielectric layer 230. The passivation structure further comprises an array of image sensors 250 adjacent to the dielectric layer 220. The interconnect vias 214, 216, 218 and the dielectric vias 222, 224, 226 electrically connect the electronic circuitry of the substrate 200 to the image sensors 250.

A transparent conductor 260 generally provides biasing of anodes of the image sensors 250. Cathodes of the image sensors 250 are generally formed by electrodes 252, 254, 256. The electrodes 252, 254, 256 are electrically connected to the dielectric vias 222, 224, 226.

For the purposes of describing the invention, the image sensors 250 include electrodes and inner layers. However, the invention is also applicable to other configurations of the image sensors 250. Additionally, the passivation structure of the invention can be used with other elevated devices, such as, organic light emitting diodes.

The image sensors 250 conduct charge when the image sensors receive light. The substrate 200 generally includes sense circuitry and signal processing circuitry. The sense circuitry senses how much charge the image sensors 250 have conducted. The amount of charge conducted represents the intensity of light received by the image sensors 250. Generally, the substrate 200 can be CMOS (complementary metal oxide silicon), BiCMOS or Bipolar. The substrate 200 can include various types of substrate technology including charged coupled devices.

Typically, the interconnect structure 210 is a standard interconnection structure. The structure and methods of forming the interconnect structure 210 are well known in the field of electronic integrated circuit fabrication. The interconnect structure 210 can be a subtractive metal structure, or a single or dual damascene structure.

The dielectric layer 220 provides reliability and structural advantages to the elevated pixel sensor structure. The dielectric layer 220 electrically connects the pixel electrodes 252, 254, 256 to the interconnect structure 210.

The conductive vias 222, 224, 226 pass through the dielectric layer 220 and electrically connect the pixel electrodes 252, 254, 256 to the substrate 200. Typically, the conductive vias 252, 254, 256 are formed from tungsten. Tungsten is generally used during fabrication because tungsten can fill high aspect ratio holes. That is, tungsten can be used to form narrow and relatively long interconnections.

Typically, the conductive vias 252, 254, 256 are formed using a chemical vapor deposition (CVD) process. Other materials which can be used to form the conductive vias 252, 254, 256 include copper, aluminum or any other electrically conductive material.

There are several structural advantages to having the dielectric layer 220 between the pixel electrodes 252, 254, 256 and the substrate 200. This structure allows the interconnection circuitry to be tightly packed. First of all, lateral space is conserved because the vias 252, 254, 256 are located directly underneath the pixel electrodes. Secondly, the structure allows the formation of vias 252, 254, 256 having a minimal diameter. CVD processes are generally the best method of forming the vias 252, 254, 256. A Tungsten CVD process allows for the formation of small diameter vias. However, the temperatures required to form tungsten vias with a CVD process are greater than many of the materials (amorphous silicon for example) to form the pixel electrodes can withstand. By forming the dielectric layer 220 over the substrate 40, and the pixel electrodes 252, 254, 256 over the dielectric layer 220, the vias 252, 254, 256 can be formed before the pixel electrodes 252, 254, 256, and therefore, the pixel electrodes 252, 254, 256 are not subjected to the high temperatures required for the formation of the vias 252, 254, 256.

The dielectric layer 220 of FIG. 2 includes an interlayer planarization dielectric layer 230 and a passivating layer 240.

The interlayer planarization dielectric layer 230 provides a flat planar surface. The interlayer planarization dielectric layer 230 includes a low dielectric constant which minimizes interlayer capacitance. The planarization of the interlayer planarization dielectric layer 230 improves step coverage of the passivating layer 240 which allows thickness of the passivating layer 240 to be minimized. The interlayer planarization dielectric layer 230 can be formed from an oxide, like, $SiO_2$.

The passivating layer 240 provides protection of the interconnect vias 214, 216, 218 and electronic circuitry on the substrate 200 from moisture. The passivating layer 240 can be formed from a nitride or a carbide.

The dielectric layer 220 is formed before the image sensors 250. Therefore, the image sensors are not subjected to high temperatures which may be required during the formation of the dielectric layer 220.

Figure 3:
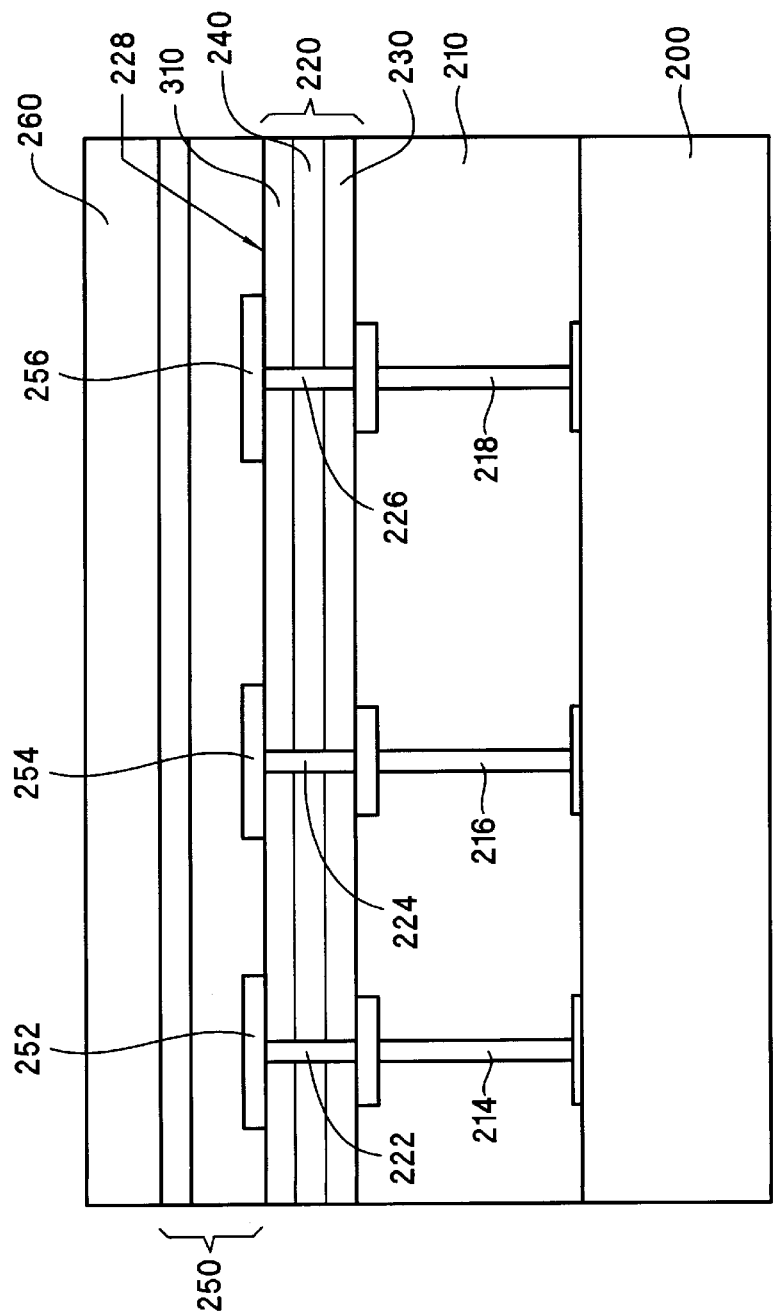
FIG. 3 shows an embodiment of the invention which includes passivation protection of electrical interconnects and electrical circuitry associated with an array of image sensors.

FIG. 3 shows another embodiment of the invention. This embodiment further includes an adhesion layer 310 within the dielectric layer 220 which is formed adjacent to the passivating layer 240. The adhesion layer 310 provides adhesion between the passivating layer 240 and the image sensors 250. The adhesion layer 310 can be formed from an oxide, a nitride or a carbide.

Figure 4:
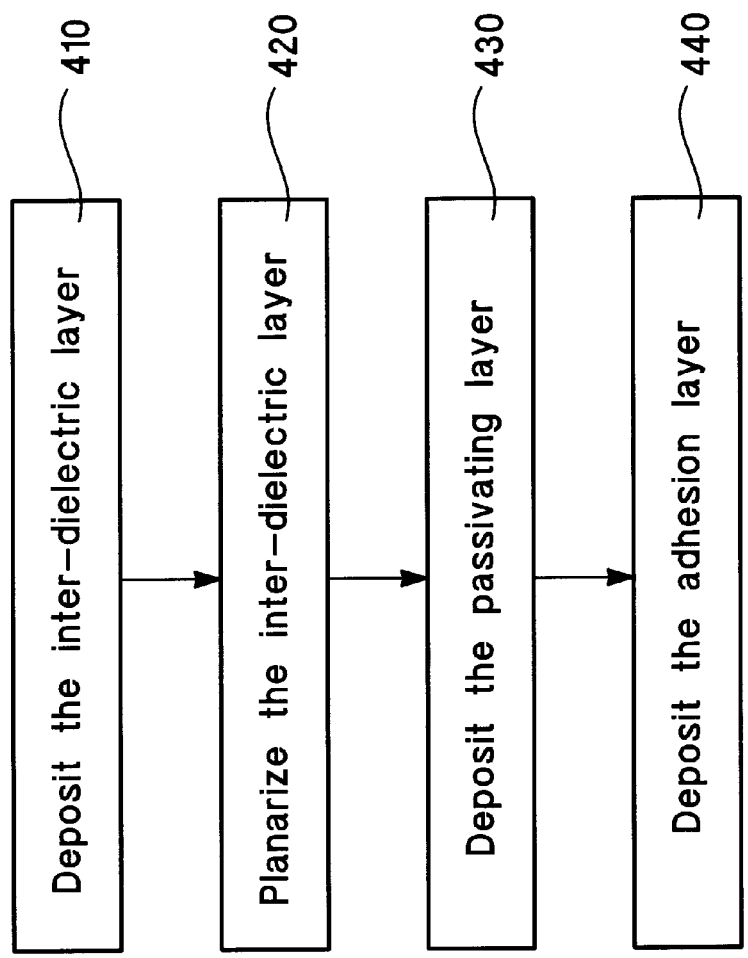
FIG. 4 shows a flow chart which depicts steps of a method of forming the dielectric layer 220 of the embodiments of the invention.

FIG. 4 shows a flow chart which depicts steps of a method of forming the dielectric layer 220 of the embodiments of the invention.

A first step 410 of forming the dielectric layer 220 includes depositing the inter-dielectric layer 230 over the interconnect structure 210. The inter-dielectric layer 230 can be deposited through plasma etch chemical vapor deposition (PECVD). The inter-dielectric layer 230 can also be deposited through bias sputtering which shapes the inter-dielectric layer 230 on the interconnect structure 210. This methods of depositing the dielectric layer 220 are well known in the art of semiconductor processing.

A second step 420 includes planarizing the inter-dielectric layer 230. Generally, the inter-dielectric layer 230 is planarized through a chemical, mechanical process (CMP). CMP provides the best uniformity of the surface. CMP is a well known process in the art of semiconductor processing.

A third step 430 includes depositing the passivating layer 240. The passivating layer 240 is typically deposited through bias sputtering process or a sputter deposit process. These depositing processes are well known in the art of semiconductor processing.

A fourth step 440 includes depositing the adhesion layer 310. The adhesion layer 310 is typically deposited through bias sputtering process or a sputter deposit process. These depositing processes are well known in the art of semiconductor processing.

Vias are etched through the dielectric layer 220 to allow for the deposition of the pixel electrodes 252, 254, 256.

Although specific embodiments of the invention have been described and illustrated, the invention is not to be limited to the specific forms or arrangements of parts so described and illustrated. The invention is limited only by the claims.

What is claimed is:

1. An integrated circuit sensor structure comprising:

a substrate comprising electronic circuitry;

an interconnect structure adjacent to the substrate, the interconnect structure comprising conductive interconnect vias which pass through the interconnect structure;

a dielectric layer adjacent to the interconnect structure, the dielectric layer having a planar surface, the dielectric layer comprising conductive dielectric vias which pass through the dielectric layer and are electrically connected to the interconnect vias, the dielectric layer further comprising:

an interlayer planarization dielectric layer adjacent to the interconnect structure;

a passivating layer adjacent to the interlayer planarization dielectric layer;

the integrated circuit sensor structure further comprising sensors adjacent to the dielectric layer; wherein the interconnect vias and the dielectric vias electrically connect the electronic circuitry to the sensors.

2. The integrated circuit passivation structure of claim 1, wherein the dielectric layer further comprises an adhesion layer adjacent to the passivating layer.

3. The integrated circuit passivation structure of claim 1, wherein the sensors comprise light sensitive active image sensors.

4. The integrated circuit passivation structure of claim 1, wherein the interlayer planarization dielectric layer comprises an oxide.

5. The integrated circuit passivation structure of claim 1, wherein the passivating layer comprises nitride.

6. The integrated circuit passivation structure of claim 1, wherein the passivating layer comprises carbide.

7. The integrated circuit passivation structure of claim 2, wherein the adhesion layer comprises oxide.

8. The integrated circuit passivation structure of claim 2, wherein the adhesion layer comprises nitride.

9. The integrated circuit passivation structure of claim 2, wherein the adhesion layer comprises carbide.

* * * * *